(12) United States Patent
Ang et al.

(10) Patent No.: US 7,598,749 B1
(45) Date of Patent: Oct. 6, 2009

(54) INTEGRATED CIRCUIT WITH FUSE PROGRAMMING DAMAGE DETECTION

(75) Inventors: Boon Yong Ang, Santa Clara, CA (US);
Sunhom Paak, San Jose, CA (US);
Hsung Jai Im, Cupertino, CA (US);
Kwansuhk Oh, San Jose, CA (US);
Raymond C. Pang, San Jose, CA (US)

(73) Assignee: XILINX, Inc., San Jose, CA (US)

( * ) Notice: Subject to any disclaimer, the term of this patent is extended or adjusted under 35 U.S.C. 154(b) by 211 days.

(21) Appl. No.: 11/449,171

(22) Filed: Jun. 8, 2006

(51) Int. Cl.
*G01R 31/07* (2006.01)
*H01L 29/00* (2006.01)

(52) U.S. Cl. .................. 324/550; 324/537; 365/225.7; 365/201; 257/529

(58) Field of Classification Search .............. 324/550, 324/555, 158.1, 765, 527; 257/529; 365/225.7
See application file for complete search history.

(56) References Cited

U.S. PATENT DOCUMENTS

| | | | |
|---|---|---|---|
| 6,201,406 B1 * | 3/2001 | Iwanczuk et al. | 326/38 |
| 6,462,998 B1 * | 10/2002 | Proebsting | 365/205 |
| 7,009,443 B2 * | 3/2006 | Illegems | 327/525 |
| 7,321,522 B2 * | 1/2008 | Dixon et al. | 365/225.7 |
| 2006/0131743 A1 * | 6/2006 | Erickson et al. | 257/737 |

* cited by examiner

*Primary Examiner*—Vincent Q Nguyen
(74) *Attorney, Agent, or Firm*—Scott Hewett; Thomas George (57) ABSTRACT

An integrated circuit with an efuse having an efuse link includes a damage detection structure disposed in relation to the efuse so as to detect damage in the IC resulting from programming the efuse. Damage sensing circuitry is optionally included on the IC. Embodiments are used in evaluation wafers to determine proper efuse fabrication and programming parameters, and in production ICs to identify efuse programming damage that might create a latent defect.

20 Claims, 5 Drawing Sheets

INTEGRATED CIRCUIT WITH FUSE PROGRAMMING DAMAGE DETECTION

FIELD OF THE INVENTION

The present invention relates generally to semiconductor devices, and more particularly to integrated circuits with memory devices commonly called electrical fuses ("efuses").

BACKGROUND OF THE INVENTION

Many integrated circuits ("ICs") are made up of millions of interconnected devices, such as transistors, resistors, capacitors, and diodes, on a single chip of semiconductor substrate. It is generally desirable that ICs operate as fast as possible, and consume as little power as possible. Semiconductor ICs often include one or more types of memory, such as CMOS memory, antifuse memory, and efuse memory.

Efuses are usually integrated into semiconductor ICs by using a stripe (commonly also called a "link") of conducting material (metal, poly-silicon, etc.) between two pads, generally referred to as anode and cathode, so that at a fuse current level ($I_{FUSE}$) the stripe of conducting material is thermally destroyed, thus changing the resistance of the efuse stripe. This is commonly referred to as "programming" the efuse. The fuse state (i.e., whether it has been programmed) can be read using a sensing circuit, which are common in the art of electronic memories.

Unfortunately, other portions of the IC can be damaged under certain efuse programming conditions, which can lead to circuit damage, reliability issues, and even failure of the IC. Damage resulting from efuse programming can occur in the "front end" of the IC, namely in the substrate and structures typically associated with the transistors and other devices formed on a semiconductor substrate, or in the "back end" of the IC, which is generally the patterned metal layers and inter-metal dielectric overlying the front end of the IC that interconnect the devices.

IC damage occurring from programming an efuse can result from improper programming by the user. Proper efuse programming conditions depend on a number of factors, and proper efuse programming parameters are usually determined during the design and development phase of an IC. Conventional techniques for evaluating damage occurring as a result of efuse programming include identifying a damaged area, processing the IC to expose a cross section of the IC that intersects the damaged area, and looking for the damage using a scanning electron microscope ("SEM") or similar evaluation methods. Unfortunately, such techniques are time consuming, expensive, require considerable skill, and result in the destruction of the IC. In some cases, efuse programming damage is masked or exacerbated by the sample preparation. Similarly, some efuse damage results in "soft" failures, such as inter-layer current leakage or metal migration, that causes operational or reliability problems with the IC, and can not be identified using conventional techniques.

It is desirable to provide techniques for evaluating efuse programming damage in an IC that avoids limitations of conventional techniques.

SUMMARY OF THE INVENTION

An integrated circuit with an efuse having an efuse link includes a damage detection structure disposed in relation to the efuse so as to detect damage in the IC resulting from programming the efuse. Damage sensing circuitry is optionally included on the IC. Alternatively, testing equipment ("testers") is used to evaluate the damage detection structure. Embodiments are used in evaluation wafers to determine proper efuse fabrication and programming parameters, and in production ICs to identify efuse programming damage that might create a latent defect.

DETAILED DESCRIPTION OF THE DRAWINGS

Figure 1:
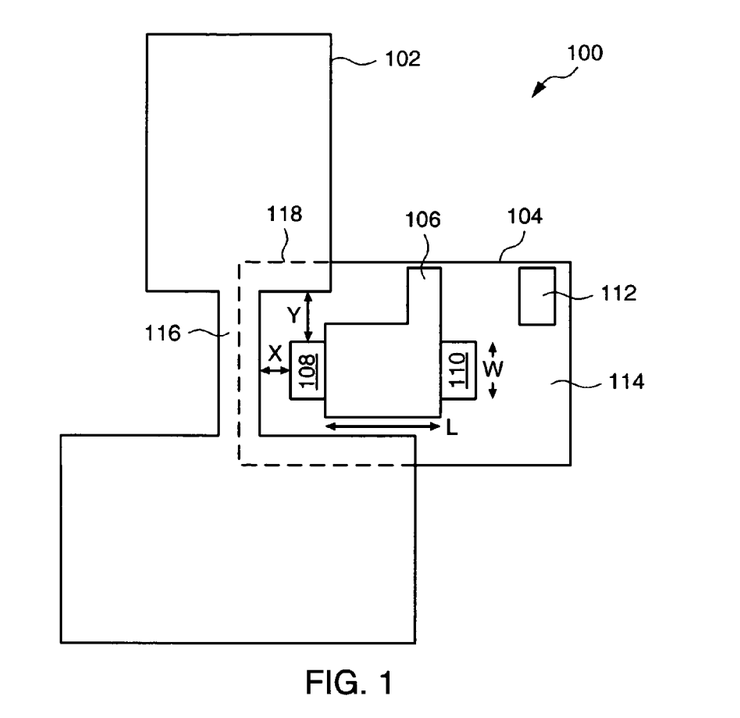
FIG. 1 is a plan view of a portion of an IC having an efuse and a front-end damage detection structure.

FIG. 1 is a plan view of a portion of an IC 100 having an efuse 102 and a front-end efuse damage detection structure 104. The front-end efuse damage detection structure is an FET (field-effect transistor) having a gate 106, a drain 108, a source 110, a well tap 112, and a well 114 extending under at least a portion of a link 116 of the efuse 102. The efuse 102 and the front-end efuse damage detection structure 104 are formed in and on a common semiconductor substrate. Other functional blocks of the IC, such as memory blocks and logic, are also formed on the semiconductor substrate.

The portion of the well 114 extending under the link 116 is represented by a dashed line 118. Alternatively, the front-end efuse damage detection structure is a diode or other device. The placement of the front-end efuse damage detection structure 104 with respect to the link 116 may be varied by moving the well 114, or by moving the FET within the well (in other words, by changing x, y, l, or w, which are indicated by double-ended arrows). It is particularly desirable to vary the placement of the front-end efuse damage detection structure in evaluation wafers, that is, wafers that are designed to evaluate efuse programming parameters. Providing a variety of efuse damage detection structures in evaluation wafers can indicate where damage is occurring under various programming conditions, and facilitate determining optimum programming parameters.

For example, rows of efuses having various damage detection structures on an evaluation IC are programmed row-by-row under different programming conditions (e.g., programming voltage, programming current, and duration), and then each row is evaluated to determine where and how efuse programming damage arises. Similarly, providing a front-end efuse damage detection structure(s) on production ICs is desirable to identify damage, including soft damage that might later result in a failure, arising due to improper customer programming. This is especially desirable because many production ICs are designed with redundancy, and it allows the user to collect data on programming effectiveness, yet still use the IC by avoiding the damaged fuse(s). Conventional sectioning and inspection techniques involve destroying a valuable IC. If user programming is creating too much efuse-related programming damage, the user may alter programming conditions to improve the efuse programming process. If programming damage to an IC is limited, the user can block out the damaged efuses and still use the IC.

The damage detection structure can be evaluated in different ways to indicate different types of damage. Transistor parameters can be evaluated before and after programming to indicate damage below the efuse link, or adjacent to the link. For example, damage, such as cracking, below the efuse link 116 is detectable by measuring the well/substrate junction of the damage detection transistor. The drain/well and source/well junctions also provide structures for sensing efuse programming damage.

P/N junction leakage current can be compared before and after programming to indicate whether the integrity of the junction has been compromised during the programming process. Junction leakage current often increases by orders of magnitude if the junction is damaged during programming, thus P/N junctions are desirable damage detection structures.

Similarly, gate current can be compared before and after programming to indicate damage to the gate dielectric layer.

FIGS. 2A-2D are circuit diagrams of electrical circuits ("damage sensing circuits") suitable for inclusion on the IC of FIG. 1 to operate in cooperation with the damage detection structure. Alternatively, external test equipment ("testers") are used to measure parameters of efuse programming damage detecting structures. Testers are connected to the damage detection structures using probes or other techniques, and in some embodiments, are connected to the damage detection structures through pads and switching paths of the IC.

Figure 2A:
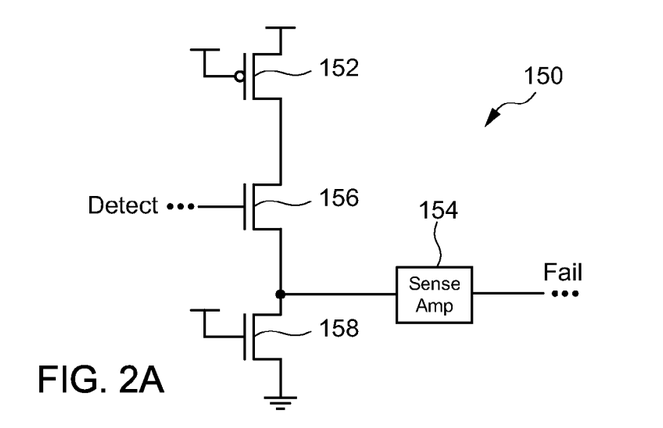
FIG. 2A shows a circuit including an efuse programming damage detection FET.

FIG. 2A shows a circuit 150 including an efuse programming damage detection FET 152 (see, e.g., FIG. 1, ref. num. 104) coupled to a voltage sense amplifier 154 through an FET 156 controlled by a detection signal ("Detect"). A very weak NMOS FET 158 has a low drive current relative to the damage-sensing PMOS FET 152. When transistor 156 is OFF, the NMOS FET 158 keeps the input to voltage sense amplifier 154 low (ground). When transistor 156 is ON (i.e., Detect signal is asserted), the PMOS FET 152 pulls the input to the voltage sense amplifier 154 up if damage is present. If the PMOS FET 152 does not detect damage, then the input to the voltage sense amplifier 154 is not pulled up.

Figure 2B:
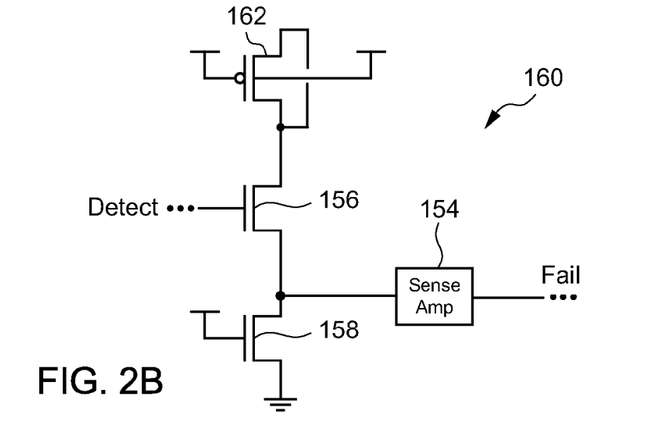
FIG. 2B shows a circuit alternatively used to detect efuse programming damage.

FIG. 2B shows a circuit 160 alternatively used to detect efuse programming damage. A damage-sensing PMOS FET 162 is coupled to a voltage sense amplifier 154 through an FET 156 controlled by a detection signal ("Detect"). A very weak NMOS FET 158 operates substantially as described above in reference to FIG. 2A, holding the input to the voltage sense amplifier 154 down unless pass transistor 156 is ON and PMOS FET 162 detects damage (i.e., has high current).

The PMOS FET 152 in FIG. 2A is suitable for detecting damage in the channel region or damage to gate oxide (see generally, FIG. 1, ref. num. 104), or between the gate and drain, or drain and well. The PMOS FET 162 in FIG. 2B is suitable for detecting damage between the source and the substrate or the drain and the substrate, and for detecting damage arising in the gate oxide. The PMOS FET 162 is configured to avoid detecting damage arising in the channel, and thus is especially desirable for use where it is desirable to sense damage in the gate oxide only (i.e., without such damage being "masked" by damage in the channel). Using multiple types of damage-sensing structures is desirable to identify the type(s) of damage that is occurring during efuse programming (in other words, where the damage is arising).

Figure 2C:
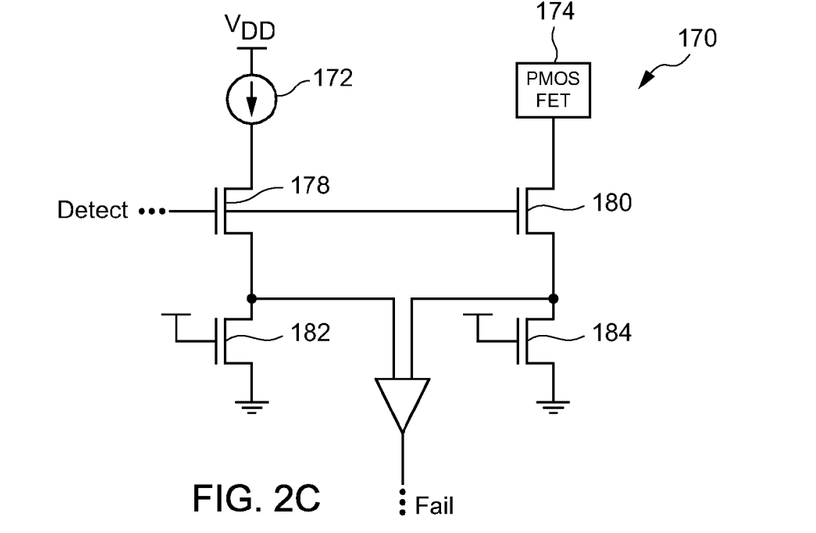
FIG. 2C shows a circuit alternatively used to detect efuse programming damage with a current source and a damage-sensing FET.

FIG. 2C shows a circuit 170 alternatively used to detect efuse programming damage. A current source 172 and a damage-sensing PMOS FET 174 (see, e.g., FIG. 2A, ref. num. 152 or FIG. 2B, ref. num. 162) are coupled to a differential amplifier 176 through pass transistors 178, 180 controlled by a common detection signal ("Detect"). Very weak NMOS FETs 182, 184 operate substantially as described above in reference to FIGS. 2A and 2B. The differential amplifier 176 provides a fail signal ("Fail") when the current passing through the damage-sensing PMOS FET 174 exceeds the current passing through the current source 172. The current provided by the current source 172 is selected according to a desired value determined during the design of the circuit. In a particular embodiment, the current source 172 acts as a reference current source, and if the current through the damage-detecting FET 174 exceeds the selected value, a FAIL signal is generated. In some embodiments, the reference current provided by current source 172 may be selectable or otherwise variable to allow for multiple reference currents.

Figure 2D:
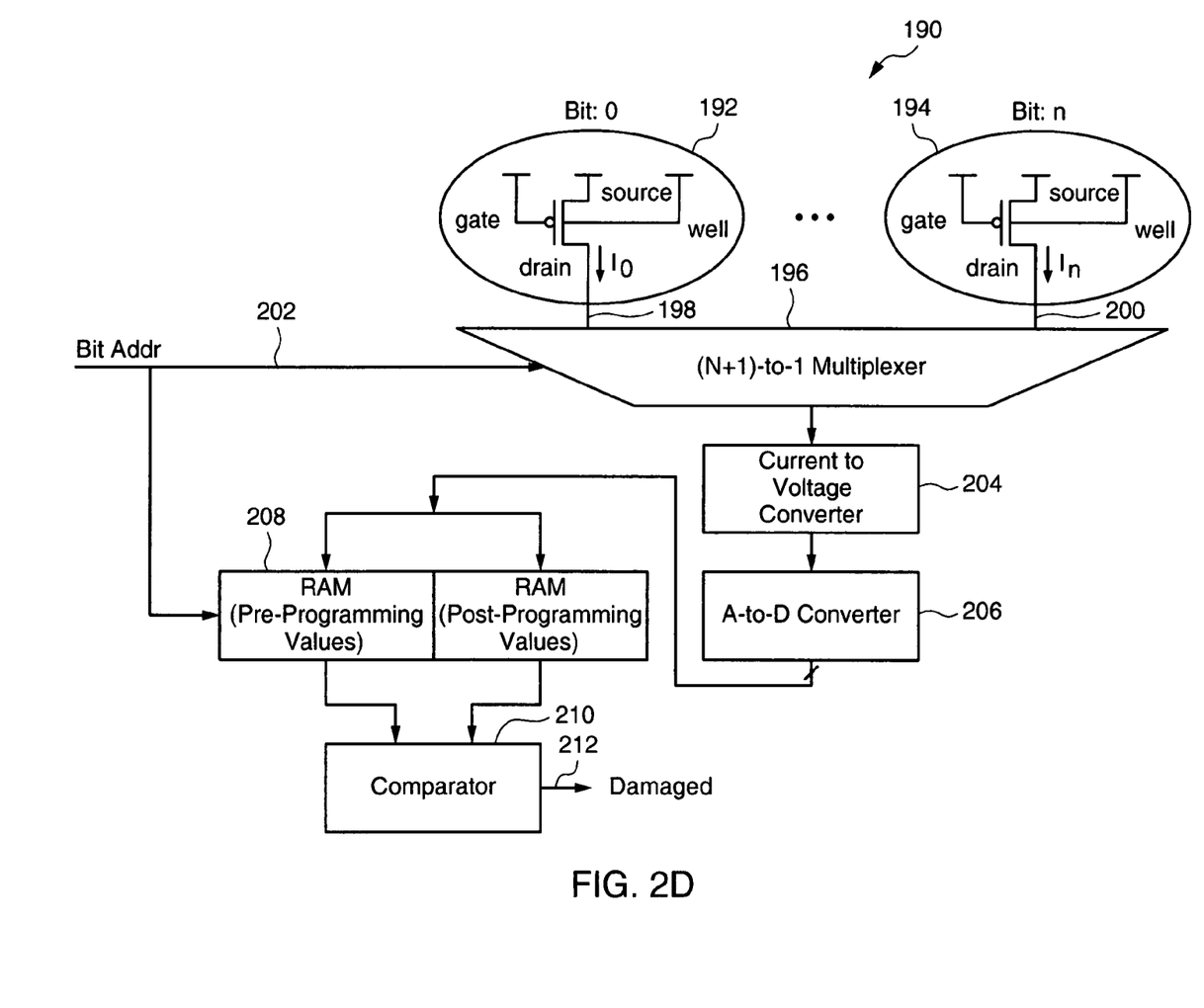
FIG. 2D is a diagram of an efuse damage sensing circuit suitable for use with an array of damage detection structures.

FIG. 2D is a diagram of an efuse damage sensing circuit 190 suitable for use with an array of damage detection structures, such as damage-sensing PMOS FETs. Other types of current-producing damage detection structures, such as back-end damage detection structures or other front-end damage detection structures, are used in alternative systems. Damage detection structures 192, 194 are coupled to a multiplexer 196. In a particular embodiment, a damage detection structure exists for each efuse in an array. In this example, there are N+1 efuses, and N+1 damage detection structures.

The current of each damage detection structure is measured before and after efuse programming. Currents are measured one at a time by selecting an input (e.g., inputs 198, 200) of the (N+1)-to-1 multiplexer 196 according to an address signal on bit address line 202. The selected current is converted to a voltage by current-to-voltage converter 204. The voltage is proportional to the amount of current from the selected damage detection structure. An analog-to-digital converter ("A/D converter") 206 converts the voltage to a binary number representation (digital value), which is stored into a random-access memory ("RAM") 208. The RAM 208 stores digital representations of currents before and after programming. FIG. 2D shows these as a "Pre-programming values" sub-block and a "Post-programming values" sub-block for purposes of illustration. Using measured base-line (i.e., pre-programming) currents from the actual damage detection structures for comparison eliminates mismatches from using separate structures to generate the reference current, and hence provides more sensitive damage detection.

A comparator 210 compares the pre- and post-programming values to indicate damage. For example, if the post-programming current value of a damage detection structure is sufficiently larger than its pre-programming current value, damage has occurred, and a damage signal 212 for the associated efuse memory cell is generated. Alternatively, only pre-programming values are stored in RAM, and the digitized post-programming value is provided directly from the A/D converter 206 to the comparator 210. The address signal on the bit address line 202 selects the desired multiplexer input (i.e., the desired damage detection structure) and also selects the appropriate pre-programming value from the RAM 208. In some embodiments, bit-specific pre-programming currents, such as bit-specific stray currents, are stored in RAM.

In an exemplary usage flow, the currents through a plurality of damage detection structures, each damage detection structure being associated with an efuse memory cell in an efuse memory array of an IC, are measured and stored in RAM. The efuses in the efuse memory cell array are programmed. In a further embodiment, different programming conditions are used during IC development for different bits (efuses) to find the optimal programming conditions. The post-programming currents through the plurality of damage detection structures are measured and stored in RAM. Alternatively, measuring the pre-programming current, programming the efuse, and measuring the post-programming current can be done on a bit-by-bit basis (i.e., serially).

The stored current values can be used to distinguish the efuse programming conditions under which damage occurs. The stored current values can also be used to indicate potentially bad bits. Bad bits might arise essentially immediately after programming, or programming might cause damage that accelerates failure of a bit. For example, efuse programming damage that did not cause an immediate failure might progress to a fail condition, which the circuit could detect by periodically polling the damage detection structures and comparing the measured currents against the pre-programming values or the original pos-programming values.

In an alternative embodiment, pre-programming values are not measured, but rather, threshold values are loaded into RAM to be used in subsequent comparisons. This allows the circuit to indicate damage only when the post-programming currents are above a certain pre-determined amount. In a further embodiment, a threshold value is used to compare against several post-programming values (e.g., a single threshold value is compared against the N+1 measured post-programming current values). In other words, the pre- and post-programming current value arrays do not necessarily contain the same numbers of entries.

Figure 5:
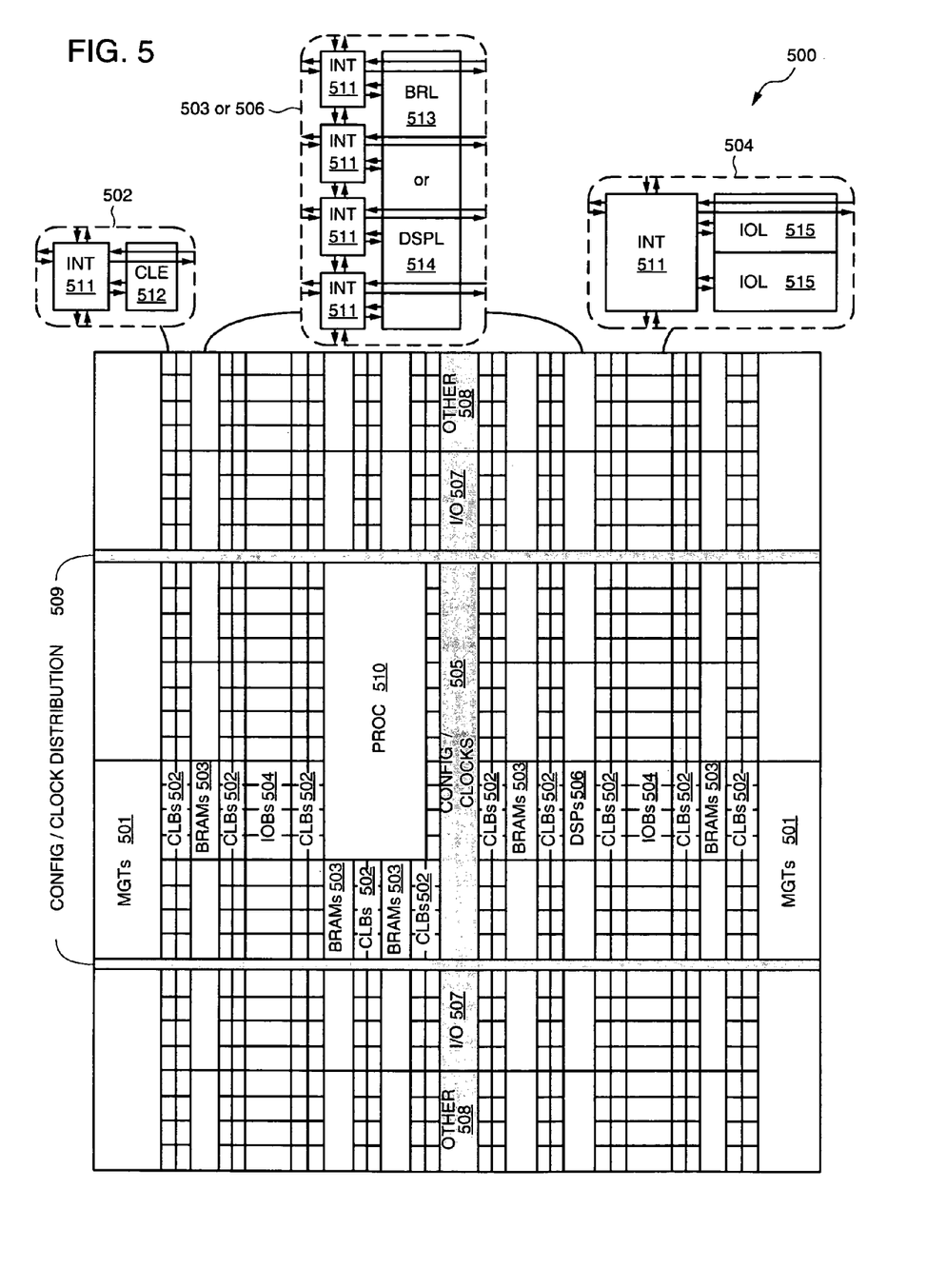
FIG. 5 is a plan view of an integrated circuit according to an embodiment of the invention.

This damage sensing system can make extremely efficient use of silicon area, especially when implemented in an FPGA (field programmable gate array) because most of the functional blocks in the efuse damage sensing circuit 190 are already present in the FPGA (see generally, FIG. 5). Block RAMs can be used to store the current values, CLBs can be used to implement the comparator 210, and the current-to-voltage converter 204 and A/D converter 206 are present as part of a larger analog block. These FPGA resources can be freed and re-used by a user design (application) after efuse programming and testing are completed.

Figure 3:
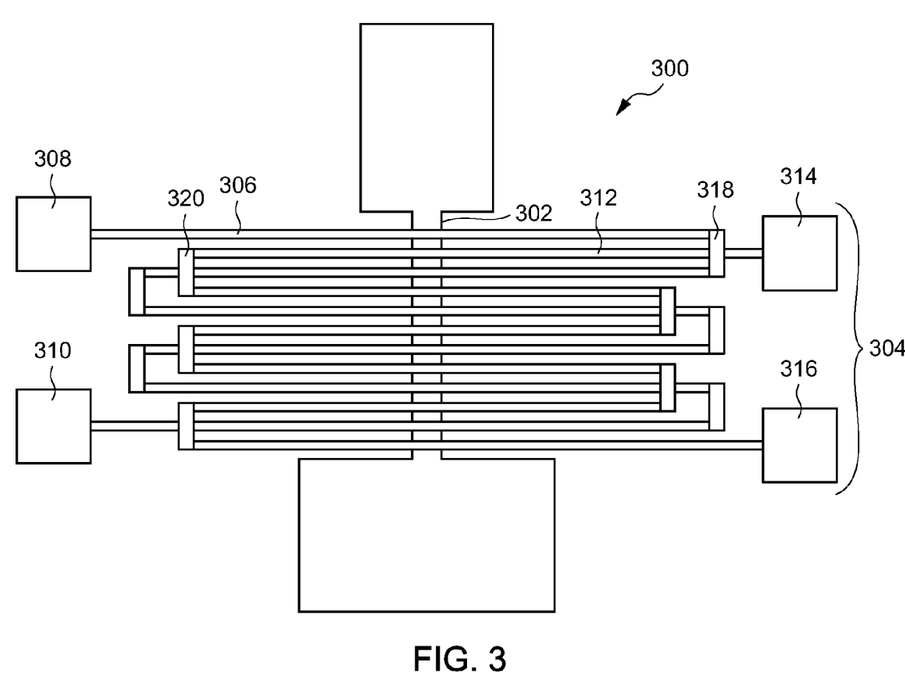
FIG. 3 is a plan view of a portion of an IC having an efuse and a back-end damage detection structure.

FIG. 3 is a plan view of a portion of an IC 300 having an efuse 302 and a back-end damage detection structure 304. The damage detection structure 304 includes a first serpentine trace 306 connected to pads 308, 310, and a second serpentine trace 312 intertwined with the first serpentine trace 306 and connected between pads 314, 316. The term "serpentine" is used solely for purposes of convenient discussion, and generally means that arms of the trace run back and forth across the link. Alternative embodiments use traces or a trace laid out in a different pattern(s).

In a particular embodiment, the first serpentine trace 306 and the second serpentine trace 312 are defined in the same metal layer (metal layer N), and bridges 318, 320 are defined in another metal layer (e.g., metal layer N+1). Metal layer N is the first patterned metal layer above the semiconductor portion of the IC, for example. In other words, the first patterned metal layer in the "backend" portion of the IC. The bridge 318 crosses over the second serpentine trace 312 to connect adjacent parallel arms of the first serpentine trace. Similarly, the bridge 320 crosses over the first serpentine trace 306 to connect adjacent parallel arms of the second serpentine trace 312.

Alternatively, the first and second serpentine traces are defined in different metal layers (e.g., one trace in metal layer N, and the other trace in metal layer N+1), thus avoiding the need for the bridges to cross over intervening trace arms, and the entire serpentine trace can be patterned in a single metal layer. Similarly, a damage detection structure includes only a single trace, which does not have to be serpentine. For example, a trace is alternatively spiral, with electrical connection to the center of the spiral being supplied in a different metal layer, or the trace is essentially spiral and folds back along itself so as to not cross or contact an electrical connection to the center of the spiral that is patterned in the same metal layer as the trace.

However, inter-layer damage is of particular concern because of its likelihood. Providing multiple traces, including multiple serpentine traces, in a single layer, such as described in conjunction with FIG. 3, is particularly desirable because it allows good coverage of the entire area of concern within a layer and high sensitivity in terms of measuring inter-trace currents.

Continuity measurements are made between the pads 308, 310 of the first serpentine trace 306, and between the pads 314, 316 of the second serpentine trace 312 allows detection of discontinuities in the metal trace(s) that can indicate a crack or void formed in the patterned metal layer of the trace, which typically includes a crack or void in the underlying dielectric layer or barrier metal(s). Without a damage detection structure, efuse programming might cause cracking or form a void that does not result in an immediate failure of the IC, but that provides a migration path for metal, such as copper out-diffusion, that results in a latent defect that eventually produces operational failure.

A bridging measurement between the first and second serpentine traces 306, 312 indicates a leakage path that otherwise should not arise. With appropriate sensing circuitry, very low levels of leakage current may be detected, and in some cases, current leakage levels that would not significantly disrupt device operation, but that indicated a latent defect, are detected.

Detecting leakage current or continuity provides quantitative values that are desirable when comparing IC structures, such as fuse link dimensions or first IMD (inter-metal dielectric) layer characteristics that is very valuable in determining the proper device design and programming parameters. Such quantitative values are not obtainable using conventional techniques of sectioning and microscopic examination. Furthermore, preparation of a sample for microscopic inspection often alters the extent of damage caused by efuse programming, and is very time consuming.

Conventional inspection techniques rely on identifying a damaged region of the IC, and sectioning that region, usually limiting evaluation of an IC to a single region. Evaluation of efuse programming damage according to embodiments of the invention allows testing several conditions on a single IC. For example, a test wafer manufactured to have several efuse links and associated damage detection structures can be used to evaluate many different programming voltages, currents, and pulse durations, which is desirably efficient in both time and in the number of test chips used.

Figure 4:
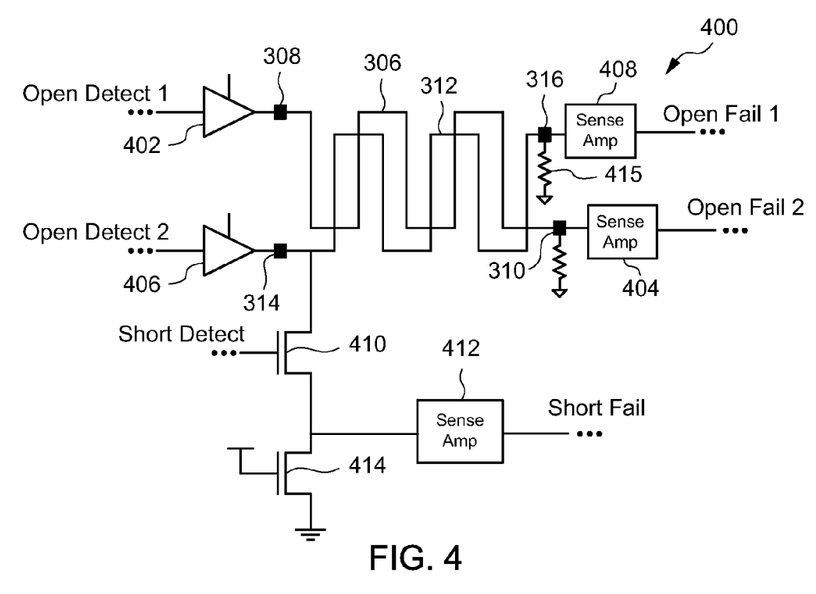
FIG. 4 is a circuit diagram of an electrical circuit suitable for inclusion on the IC of FIG. 3 to operate in cooperation with the damage detection structure.

FIG. 4 is a circuit diagram of an electrical circuit 400 ("damage sensing circuit") suitable for inclusion on the IC of FIG. 3 to operate in cooperation with the damage detection structure 304. The trace 306 extends between pads 308, 310. Pad 308 is connected to the output of a tri-state buffer 402 and pad 310 is connected to the input of voltage sense amplifier 404. Similarly, trace 312 extends between pads 314, 316, pad 314 is connected to the output of tri-state buffer 406 and pad 316 is connected to the input of voltage sense amplifier 408.

To detect an open-type failure, the short-detect transistor 410 is shut off, both tri-state buffers 402, 406 are toggled, and the outputs of voltage sense amplifiers 404, 408 are evaluated to make sure that the outputs of the voltage sense amplifiers are correct. To detect a short-type failure, tri-state buffer 406 is shut off (i.e., tri-stated) and $V_{dd}$ is provided to tri-state buffer 402. This provides a voltage differential between trace 306 and trace 312. Short-detect transistor 410 is turned ON, and current leaking between traces 306, 312 is detected by voltage sense amplifier 412. A weak NMOS FET 414 operates as described above.

The electrical circuit 400 is alternatively operated by turning off transistor 410, driving only one of the tristate buffers. A resistor 415 forms a resistive voltage divider with a trace 312, and the voltage sense amplifier 408 is connected to the center node 316 of the voltage divider. Changes in the voltage at the center node indicate a change in the resistance of the trace, or a change in stray current coupling to the trace, either of which can indicate efuse programming damage.

FIG. 5 is a plan view of an integrated circuit 500 according to an embodiment of the invention. The integrated circuit is an FPGA that includes CMOS portions in several of the functional blocks, such as in RAM and logic, and is fabricated using a CMOS fabrication process. Efuses and efuse programming damage detection devices according to one or more embodiments of the invention are incorporated in any of several functional blocks, such as a memory block, logic block, I/O block, clock circuit, transceiver, or other functional block; within many functional blocks; or within a physical section or segment of the FPGA 500. Efuse programming damage detection devices according to embodiments of the invention are particularly desirable in FPGAs for at least two reasons. First, different users might use different efuse programming requirements and efuse programming damage detection devices allows the user to optimize efuse programming parameters during IC development. Second, variations in the manufacturing or efuse programming process(es) might result in efuse programming damage that does not immediately manifest as a failure, but that creates a latent defect that results in a later failure. Providing efuse programming damage detection devices allows a circuit designer to develop efuse structures and programming conditions, and allows a user to identify and block out damaged areas so that alternative efuse of the FPGA may be used.

The FPGA architecture includes a large number of different programmable tiles including multi-gigabit transceivers (MGTs 501), configurable logic blocks (CLBs 502), random access memory blocks (BRAMs 503), input/output blocks (IOBs 504), configuration and clocking logic (CONFIG/CLOCKS 505), digital signal processing blocks (DSPs 506), specialized input/output blocks (I/O 507) (e.g., configuration ports and clock ports), and other programmable logic 508 such as digital clock managers, analog-to-digital converters, system monitoring logic, and so forth. Some FPGAs also include one or more dedicated processor blocks (PROC 510).

In some FPGAs, each programmable tile includes a programmable interconnect element (INT 511) having standardized connections to and from a corresponding interconnect element in each adjacent tile. Therefore, the programmable interconnect elements taken together implement the programmable interconnect structure for the illustrated FPGA. The programmable interconnect element (INT 511) also includes the connections to and from the programmable logic element within the same tile, as shown by the examples included at the top of FIG. 5.

For example, a CLB 502 can include a configurable logic element (CLE 512) that can be programmed to implement user logic plus a single programmable interconnect element (INT 511). A BRAM 503 can include a BRAM logic element (BRL 513) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 506 can include a DSP logic element (DSPL 514) in addition to an appropriate number of programmable interconnect elements. An IOB 504 can include, for example, two instances of an input/output logic element (IOL 515) in addition to one instance of the programmable interconnect element (INT 511). As will be clear to those of skill in the art, the actual I/O pads connected, for example, to the I/O logic element 515 are manufactured using metal layered above the various illustrated logic blocks, and typically are not confined to the area of the input/output logic element 515. In the pictured embodiment, a columnar area near the center of the die (shown shaded in FIG. 5) is used for configuration, clock, and other control logic.

Some FPGAs utilizing the architecture illustrated in FIG. 5 include additional logic blocks that disrupt the regular columnar structure making up a large part of the FPGA. The additional logic blocks can be programmable blocks and/or dedicated logic. For example, the processor block PROC 510 shown in FIG. 5 spans several columns of CLBs and BRAMs.

Note that FIG. 5 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 5 are purely exemplary. For example, in an actual FPGA more than one adjacent column of CLBs is typically included wherever the CLBs appear, to facilitate the efficient implementation of user logic.

Figure 6:
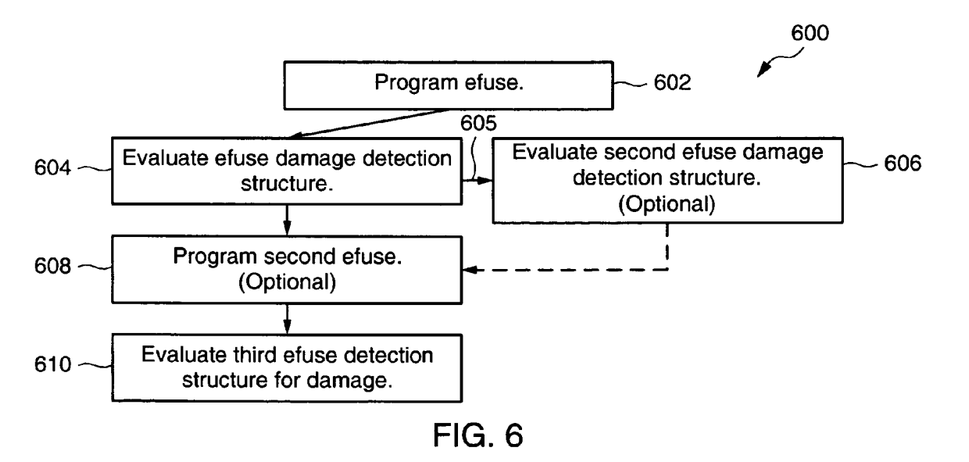
FIG. 6 is a flow chart of a method of evaluating efuse programming damage in an IC according to an embodiment of the invention.

FIG. 6 is a flow chart of a method 600 of evaluating efuse programming damage in an IC according to an embodiment of the invention. An efuse of an IC is programmed (step 602). A first efuse damage detection structure disposed in relation to the efuse so as to detect damage in the IC resulting from programming the efuse is evaluated to detect efuse programming damage (step 604). The efuse damage detection structure comprises a P-N structure or a transistor formed in the front-end portion of the IC, or comprises a trace in the back-end portion of the IC, or other efuse damage detection structure.

In an optional step (path 605), a second efuse damage detection structure disposed in relation to the first efuse is evaluated (step 606). In other words, the first efuse has multiple damage detection structures associated with it. In one embodiment, the first efuse damage detection structure is a P-N device or a transistor formed in the front-end portion of the IC and the optional second efuse damage detection structure is also a P-N device or a transistor formed in the front-end portion of the IC. Alternatively, the first efuse damage detection structure is a P-N device or a transistor formed in the front-end portion of the IC, and the optional second efuse damage detection structure is a trace or other structure formed in the back-end portion of the IC. In yet another embodiment, the first efuse damage detection structure is formed in the back-end portion of the IC and the second efuse damage detection structure is also formed in the back-end portion of the IC.

In a further embodiment, a second efuse on the IC is programmed (step 608) and an efuse damage detection structure associated with the second efuse is evaluated (step 610). In a particular embodiment, the second efuse is in a common row of efuses with the first efuse, and the first and second efuses are programmed concurrently, and then the efuses in the row are evaluated for damage. In an alternative embodiment, the second efuse is programmed after evaluating whether programming the efuse in step 602 damaged the IC. In a particular embodiment, the efuse is programmed according to first efuse programming parameters in step 602, and the second efuse is programmed according to second efuse programming parameters in step 608. For example, if efuse programming damage occurs from the first programming step, the efuse programming parameters are changed before programming the second efuse. In the case of an evaluation wafer, the efuse programming parameters might be increased in a selected fashion according to a designed experiment to determine the conditions that efuse programming damage occurs under, and hence to determine the proper programming parameters.

While the present invention has been described in connection with specific embodiments, variations of these embodiments will be obvious to those of ordinary skill in the art. Therefore, the spirit and scope of the appended claims should not be limited to the foregoing description.

What is claimed is:

1. An integrated circuit ("IC") comprising:
    an efuse having a link; and
    a damage detection structure disposed in relation to the efuse so as to detect damage in portions of the IC other than the efuse which result from programming the efuse.

2. The IC of claim 1 wherein the damage detection structure comprises a front-end damage detection structure.

3. The IC of claim 2 wherein the front-end damage detection structure is a field-effect transistor having a well.

4. The IC of claim 3 wherein a portion of the well extends below at least a portion of the link.

5. The IC of claim 2 further comprising a second damage detection structure.

6. The IC of claim 5 wherein the second damage detection structure is a second front-end damage detection structure.

7. The IC of claim 2 wherein the front-end damage detection structure is a P-N device.

8. The IC of claim 1 wherein the damage detection structure comprises a back-end damage detection structure.

9. The IC of claim 8 wherein the back-end damage detection structure comprises a trace.

10. The IC of claim 9 wherein the trace is a first serpentine trace.

11. The IC of claim 10 wherein the back-end damage detection structure further comprises a second trace.

12. The IC of claim 11 wherein the first serpentine trace and the second trace are formed in a first metal layer, and are intertwined, and further comprising a bridge formed in a second metal layer, the bridge connecting a first arm of the first serpentine trace to a second arm of the first serpentine trace.

13. The IC of claim 1 further comprising a damage sensing circuit connected to the damage detection structure.

14. The IC of claim 1 wherein the IC is a field programmable gate array.

15. A method of detecting damage on an integrated circuit ("IC") comprising:
    programming an efuse of the IC; and
    evaluating an efuse damage detection structure disposed in relation to the efuse so as to detect damage in portions of the IC other than the efuse which result from programming the efuse.

16. The method of claim 15 further comprising evaluating a second efuse damage detection structure disposed in relation to the efuse so as to detect damage in the IC resulting from programming the efuse.

17. The method of claim 16 wherein the efuse damage detection structure is a first front-end efuse damage detection structure and the second efuse damage detection structure is a second front-end efuse damage detection structure.

18. The method of claim 15 wherein the efuse is programmed according to first efuse programming parameters and further comprising a step, after evaluating the efuse damage detection structure, of
    programming a second efuse according to second efuse programming parameters; and
    evaluating a second efuse damage detection structure disposed in relation to the second efuse so as to detect damage in the IC resulting from programming the second efuse.

19. A system for detecting damage in an integrated circuit comprising:
    means for programming an efuse;
    means for detecting efuse programming damage disposed in relation to the efuse so as to detect efuse programming damage in portions of the integrated circuit other than the efuse which result from programming the efuse; and
    means for sensing efuse programming damage connected to the means for detecting efuse programming damage.

20. The system of claim 19 wherein the integrated circuit is a field programmable gate array.

* * * * *

UNITED STATES PATENT AND TRADEMARK OFFICE
CERTIFICATE OF CORRECTION

PATENT NO. : 7,598,749 B1  Page 1 of 1
APPLICATION NO. : 11/449171
DATED : October 6, 2009
INVENTOR(S) : Ang et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 269 days.

Signed and Sealed this

Twenty-eighth Day of September, 2010

David J. Kappos
*Director of the United States Patent and Trademark Office*